United States Patent [19] [11] 3,885,219
Vaughn [45] May 20, 1975

[54] FAIL-SAFE ELECTRONIC AMPLIFYING CIRCUIT

[75] Inventor: Thomas C. Vaughn, Plum Borough, Pa.

[73] Assignee: Westinghouse Air Brake Company, Swissvale, Pa.

[22] Filed: Jan. 22, 1973

[21] Appl. No.: 325,651

[52] U.S. Cl. ................ 330/30 D; 330/100; 330/165
[51] Int. Cl. ................ H03f 3/68
[58] Field of Search ............ 330/30 D, 69, 100, 165

[56] References Cited

UNITED STATES PATENTS

| | | | |
|---|---|---|---|
| 3,111,630 | 11/1963 | Wolcott | 330/100 X |
| 3,375,457 | 3/1968 | Hollstein, Jr. | 330/30 D |
| 3,721,914 | 3/1973 | Nakamura | 330/30 D |
| 3,728,559 | 4/1973 | Spann et al. | 350/30 D |

FOREIGN PATENTS OR APPLICATIONS

| | | | |
|---|---|---|---|
| 1,145,837 | 3/1969 | United Kingdom | 330/30 D |

*Primary Examiner*—James B. Mullins
*Attorney, Agent, or Firm*—H. A. Williamson; J. B. Sotak

[57] ABSTRACT

This disclosure relates to a fail-safe push-pull differential amplifier including a first and a second transistor. A source of a.c. signals connected to the input circuit of the first transistor and a negative feedback loop connected to the input circuit of the second transistor. A difference signal is derived from the output circuit of the first and second transistors. The difference signal is transformer coupled to an amplifier which powers a load and supplies a degenerative input signal to the feedback loop so that a high voltage gain exists when and only when no critical component or circuit failure is present.

8 Claims, 1 Drawing Figure

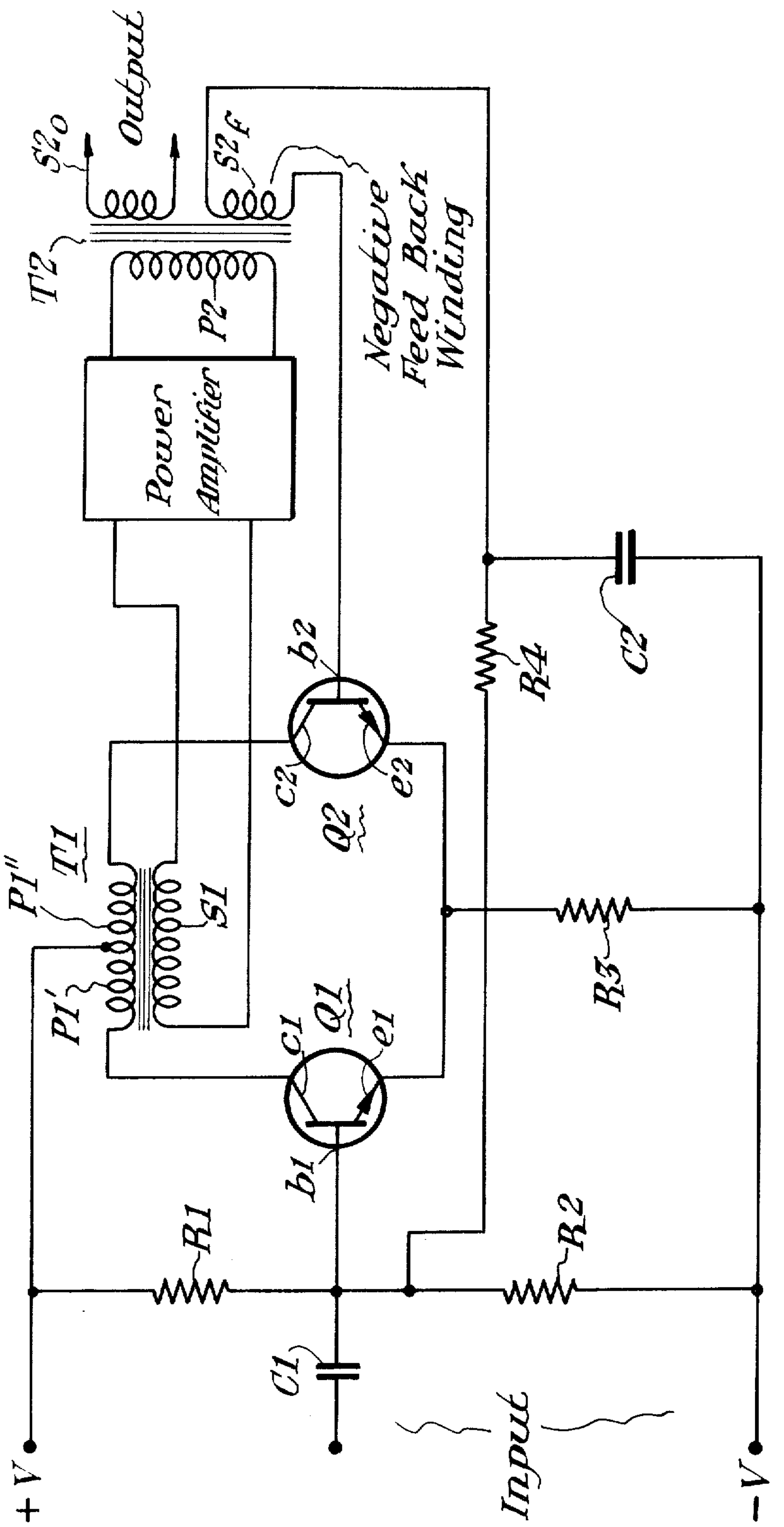
Output
S2o
S2f
T2
P2
Power Amplifier
Negative Feed Back Winding
b2
R4
C2
c2
Q2
e2
P1''
T1
S1
P1'
R3
c1
Q1
e1
b1
R1
R2
C1
Input
+V
−V

FAIL-SAFE ELECTRONIC AMPLIFYING CIRCUIT

My invention relates to a unique vital electronic differential amplifying circuit and, more particularly, to a fail-safe high gain transistorized difference amplifier having a d.c. biasing and an a.c. degenerative feedback arrangement which ensures that a critical circuit or component failure is incapable of producing a false or unsafe output condition.

In literally every signal and control system for mass and/or rapid transit operations, it is of paramount importance to exercise extreme care in designing and constructing the various networks and circuits of the system in order to preclude possible injury to persons and prevent costly damage to the equipment. That is, in order to provide the highest degreee of safety to individuals as well as apparatus, it is necessary and essential that under no circumstances will a failure cause or be capable of causing a true or valid output condition. Accordingly, it will be appreciated that the apparatus must operate in a fail-safe manner so that any conceivable possible failure will result in a condition at least as restrictive and, preferably, more restrictive than that preceding the failure. For example, a circuit malfunction or component failure in a vehicle speed control system should not be permitted to erroneously simulate and indicate a command for maintaining or increasing the actual speed of the vehicle. It is also mandatory, in an automatic electronic speed control system of this type, to ensure that internally as well as externally generated noise voltage signals should not be capable of producing an erroneous speed comand output signal. This has been found to be a difficult task in certain electronic circuits, such as, semiconductive or transistor amplifiers. In the past, the voltage gain of solid state amplifiers was limited to unity, and passive networks or elements, such as, transformers, were employed to raise the amplitude or level of the voltage. Most of these prior transistor amplifier circuits were not wholly acceptable in that they either had a high degree of harmonic distortion when operated non-linearly or had a low degree of efficiency when operated linearly. While tuned filters are effective in removing most of the distortion, the electrical elements of the circuits, such as, the capacitors and inductors, become extremely bulky and expensive to manufacture. In addition, when the amplifier is adapted to handle a number of distinct frequencies or is required to operate over a wide band of frequencies, the tuned filtering circuits become a very complicated maze or myriad of elements. Thus, these complex filters are vulnerable to various types of electrical failures and are susceptible to power diminution due to heat energy losses. One obvious and satisfactory method would be an attempt to eliminate or avoid the use of bulky elements and complex tuned circuits. While at first glance it would appear simply necessary to increase the amplitude of the picked-up signals by a suitable electronic amplifying circuit, most of the common or standard types of high gain amplifying circuits, however, are nonvital networks and, therefore, their use in the wayside transmitter of a fail-safe cab signaling system is intolerable. In addition, previous vital amplifying circuits were generally low gain circuits capable of producing output signals which could effectively operate the selective speed sensing circuits of the carborne apparatus. It will be appreciated that the abovementioned harmonic distortion can be easily removed by operating the active elements, namely, the transistors or tubes on the linear portion of the dynamic transfer characteristic curve. However, linear operation is accompanied by a very great or substantial degree in the power gain and efficiency. However, the overall gain of the amplifying circuit can be reduced by providing negative feedback from the output to the input. Previously, a degenerative type of electronic feedback amplifier was unsafe in that the loss of degeneration would increase the gain and allow smaller amplitude signals than normal which could cause valid appearing output signals. In vital or fail-safe systems, it is positively unacceptable to allow the normal gain of an amplifier to increase by a failure, such as, a short-circuited or open-circuited portion or element of the circuit. Accordingly, it is necessary to ensure that the loss of the negative feedback results in a total gain of the amplifier less than that which is available with the presence of the negative feedback.

It is therefore an object of my invention to provide a fail-safe electronic amplifier, the output voltage of which is less than with negative feedback.

A further object of my invention is to provide a fail-safe difference amplifier which has a gain greater than unity.

Another object of my invention is to provide a fail-safe high gain push-pull differential amplifying circuit.

Yet another object of my invention is to provide a vital electronic amplifier circuit including degenerative feedback for providing a maximum amount of voltage gain when and only when no critical component or circuit failure is present.

Still another object of my invention is to provide a vital solid state circuit having a feedback type of amplifier in which the total gain is the highest when the feedback loop supplies the appropriate d.c. biasing voltage to the amplifier.

Still a further object of my invention is to provide an improved differential amplifier having degenerative feedback for establishing the maximum voltage gain when all the components are intact and are operating in a proper manner.

Yet a further object of my invention is to provide a fail-safe differential amplifier circuit, a first and a second active element and including a feedback path which provides d.c. biasing voltage for said second active element.

Still yet a further object of my invention is to provide a fail-safe transistorized differential, amplifying circuit which is simple in design, reliable in operation, durable in use, and efficient in service.

In accordance with this invention, a fail-safe transistor differential amplifying circuit employs negative feedback to establish the maximum voltage gain in the overall circuit. The fail-safe differential amplifier includes a first and a second matched transistor each having an emitter, a collector, and a base electrode. A voltage divider including a pair of resistors is connected between the positive and negative terminal ground of a d.c. biasing voltage supply. The base electrode of the first transistor is connected to the junction point of the pair of resistors. The emitter electrodes of each of the transistors are directly coupled together and are connected to the negative terminal by a common resistor or d.c. source. The collector electrodes of each of the transistors are connected to the respective ends of the primary winding of a center tapped transformer. The center tap is directly connected to the potential terminal. The secondary winding of the center tapped transformer is coupled to the input of a power amplifier. The output of the power amplifier is transformer coupled to a first secondary winding which feeds a load. A second secondary with the output transformer provides negative feedback voltage to the differential amplifier. One end of the feedback winding is connected to the base of the second transistor. The other end of the feedback winding is coupled to the negative terminal by a bypass capacitor and is also connected to the junction point of the pair of resistors by a biasing supply resistor. An a.c. input signal is applied to the base electrode of said first transistor by a coupling capacitor. The first and second transistors operate in a push-pull manner when a.c. signals are applied to the input of the first transistor. The input of the second transistor is supplied with the feedback signal. Thus, the output voltage appearing across the collector electrodes of the first and second transistors is gain times the difference between the a.c. input signal and the negative feedback signal. The output voltage is applied to the power amplifier and supplies voltage to the load winding and to the feedback winding. The load voltage will continue to be supplied as long as no critical component or circuit failure is present. A shorted wire or component or an open wire or component destroys the a.c. amplification characteristics or the d.c. biasing voltage requirements of the differential amplifier so that the voltage gain is drastically reduced and the voltage across the load is dramatically decreased to substantially an insignificant amount.

For a more complete understanding of my invention as well as realizing other objects and advantages therefrom, reference is made to the following detailed description taken in conjunction with the accompanying drawing in which:

The single FIGURE illustrates a schematic circuit diagram of the fail-safe circuit transistorized differential amplifier embodying the present invention.

Referring now to the drawing, there is shown a fail-safe transistor amplifying circuit in accordance with my invention. As shown, the amplifying circuit is a multistage electronic arrangement including a first and second solid state device, such as, a pair of matched active elements in the form of NPN transistors Q1 and Q2. The transistor Q1 includes an emitter electrode *e*1, a collector electrode *c*1 and a base electrode *b*1, while the transistor Q2 includes an emitter electrode *e*2, a collector electrode *c*2, and a base electrode *b*2. The transistors Q1 and Q2 are connected in a push-pull common mode rejection differential amplifying configuration. It will be noted that a voltage dividing network is connected across the positive terminal +V and the negative terminal −V of a d.c. voltage supply, not shown. As shown, the voltage divider includes series connected resistors R1 and R2 with the upper end of resistor R1 connected to terminal +V and with the lower end of resistor R2 connected to terminal −V. The base electrode of transistor Q1 is directly connected to the junction point of the resistors R1 and R2. A coupling capacitor C1 is connected to the junction point of the voltage divider and supplies a.c. input signals to the base electrode *b*1 from a suitable source of a.c. voltage, not shown. It will be noted that emitter electrodes *e*1 and *e*2 are connected together and are connected to one end of a relatively large common resistor R3. The other end of resistor R3 is connected to the negative terminal −V, namely, the common or ground lead of the d.c. biasing voltage supply source. The collector electrodes *c*1 and *c*2 of transistors Q1 and Q2 are respectively connected to the center tapped primary windings P1′ and P1″ of a stepdown transformer T1. For example, the collector electrode *c*1 is coupled to the left-handed end of the primary winding P1′ while the collector or electrode *c*2 is connected to the right-handed end of the primary winding P1″. The center tap of the primary windings P1′ and P1″ is directly coupled to the positive terminal V+ of the d.c. biasing voltage supply source. The multi-turn secondary winding S1 of transformer T1 is coupled to the input of a power amplifier PA. The power amplifier PA is a conventional solid state or transistor circuit which may include a sufficient number of amplifying stages to provide ample gain.

The output of the power amplifier is coupled to the primary winding P2 of the output transformer T2. As shown, the transformer T2 has a multiple of separate secondary windings $S2_o$ and $S2_f$. The secondary winding $S2_o$ supplies output voltage to a suitable load, such as, a vital relay or a fail-safe electronic logic circuit of the automatic speed control system. The secondary winding $S2_f$ of the transformer T2 supplies negative feedback voltage or signals to the differential amplifier and in fact to the input of transistor Q2. As shown, one end of the secondary winding $S2_f$ is connected to the base electrode *b*2 of transistor Q2. The other end of the feedback winding $S2_f$ is connected to a capacitor C2 which bypasses the a.c. signals to ground and to a resistor R4 which is connected to the junction point of the voltage divider. THus, the resistor R4 and capacitor C2 shunt the a.c. input signals to ground while the resistor R4 completes the circuit path for providing the necessary d.c. biasing voltages for the second transistor Q2. Thus, the feedback loop supplies the degenerative a.c. signals to the input of transistor Q2 and also applies the d.c. operating potential to the base electrode *b*2 of transistor Q2. It will be appreciated that the degenerative feedback operation is highly advantageous because the gain is stabilized, the bandwidth response is broadened, the amount of distortion is minimized, and the input and output impedances can more closely be matched to the source and load, respectively.

Turning now to the operation of the fail-safe differential amplifying circuit, it will be initially assumed that the a.c. input signals and the necessary operating potentials are applied to the circuit, and that the circuit is intact and functions properly. Under this condition, the a.c. signals are coupled to the base electrode *b*2 by capacitor C1 and simultaneously negative feedback signals induced in secondary winding $S2_f$ are applied to the base electrode *b*2. It will be appreciated that the differential amplifier is a difference device which amplifies the dissimilation between two input signals, namely, the a.c. input signal and the negative feedback signal. The difference input signal is amplified by the Q or gain factor of the differential amplifier. In other words, the output voltage developed across the center tapped primary windings P1′ and P1″ is gain times the difference voltage applied to the inputs of transistors Q1 and Q2. The voltage induced is stepped up and is applied to the input of the power amplifier which produces a gain in the signal power. The amplified output of amplifier PA develops a voltage across primary winding P2 which induces an a.c. voltage in output secondary winding $S2_0$ and feedback secondary winding $S2_f$. As previously mentioned, signals induced in the secondary winding $S2_0$ energize a fail-safe device, such as, a vital speed control relay. On the other hand, the signals induced in the secondary winding $S2_f$ are fed back to the input of the differential amplifying circuit. That is, negative a.c. feedback voltage developed across winding $S2_f$ is applied to the input circuit of the secondary transistor Q2 of the differential amplifier. Thus, during normal operation, the amplified output voltage appearing across the primary windings of transformers T1 is: $E \text{ out} = Av\ (Em\text{-}E_f)$
wherein:

$E$ out = a.c. output voltage
$E$ in = a.c. input voltage
$E_f$ = a.c. feedback voltage
$An$ = voltage gain As long as the circuit is operating properly and as long as no critical circuit or component failure is present, the maximum amount of voltage will be developed across the primary winding of transformer T1 since the gain of the differential amplifier is the greatest value attainable only when degeneration is present. The disclosed circuit has been specifically designed in accordance with the fail-safe principles approved by the Association of American Railroads. Thus, it will be understood that the gain of the amplifier must not be increased by a failure or be equal to the level just prior to the failure. Hence, it is mandatory in meeting the criteria of fail-safe operation to positively ensure that the amplitude of the output of an amplifier must be decreased during the presence of a critical component or circuit failure. It will be noted that a short-circuited condition as well as an open-circuited condition either results in the destruction of the a.c. amplification ability of the differential amplifier or power amplifier or causes the removal of the necessary d.c. operating potentials.

As previously mentioned, the negative feedback loop of the differential amplifier ensures that a failure, namely, an open or short-circuited condition is incapable of causing valid output signals. For example, an open feedback loop removes the biasing voltages from the transistor Q2 and renders it nonconductive. Thus, the base-emitter junction assumes a relatively high resistance so that the gain of the amplifier is dramatically reduced. Further, the shorting of the feedback winding $S2_f$ removes or at least reduces the level of the output voltage applied to the load, and thus the power developing quality of the amplifier is degraded. The opening or shorting of any of the other windings of the transformer T1 or T2 interrupts the a.c. signal path or destroys the necessary transformer action so that no a.c. output signal will be induced in the secondary winding $S2_0$. The opening of capacitor C1 results in the removal of the a.c. input signal to the base electrode $b1$ while the shorting of capacitor C1 is a safe failure. The opening of capacitor C2 interrupts the a.c. feedback circuit for transistor Q2 while the shorting of capacitor C2 removes the necessary biasing potentials. Thus any of the above-mentioned failures results in the deterioration of the output signal or does not adversely affect the amplifier operation. That is, by employing carbon composition types of resistors the possibility of a shorted resistive element is eliminated. Further, it will be appreciated that the opening or shorting of any active element, such as, the transistors, either destroys the necessary amplification qualities of a particular stage or upsets the necessary biasing potentials to an extent where no output is capable of being produced. Thus, the disclosed circuit operates in a fail-safe manner to provide an output signal when, and only when, all the components are intact and operating properly.

While my invention has been described with regard to a differential amplifier for cab signaling applications, it will be understood that the invention may have utility in other systems and unrelated areas remote from mass and/or rapid transit. Further, it will be understood that opposite types of transistors may be employed to those shown simply by reversing the polarity of the d.c. supply voltage. In addition, it is understood that other types of active elements, such as, tubes or the like, may be used. Further, PNP transistors may obviously be used in place of the NPN transistors Q1 and Q2.

Therefore, it will be appreciated that the foregoing description of my invention is only illustrative and it is not intended that the invention be limited thereto. Thus, sundry variations, alterations, and modifications may be made by those skilled in the art without departing from the spirit and scope of my invention.

Having thus described my invention, what I claim is:

1. An electronic circuit comprising, a first and a second transistor each having an emitter, a collector and a base electrode and interconnected as a differential amplifier, a source of a.c. signals applied to the input of said first transistor of said differential amplifier, said emitter electrodes of said transistors are coupled to a first source of biasing voltage by a common resistor, said collector electrodes of said transistors are coupled to a second source of biasing voltage by a transformer, said base electrodes of said transistors are respectively coupled to said a.c. signals and to negative feedback signals by impedance means, a difference signal derived from the output of said first and said second transistors of said differential amplifier and applied to the input of a power amplifier, a feedback circuit applying d.c. operating potential to said second transistor of said differential amplifier, and the output of said power amplifier supplies said negative feedback signals over said feedback circuit to the input of said second transistor of said differential amplifier and provides an a.c. output signal which is the maximum gain times the difference between said a.c. input signals and said negative feedback signal plus the gain of said power amplifier to a load when and only when each critical circuit or component is functioning properly in a safe manner.

2. An electronic circuit as defined in claim 1, wherein said difference signal of said differential amplifier is transformer coupled to said power amplifier.

3. An electronic circuit as defined in claim 1, wherein said first and second transistors of said differential amplifier operate in a push-pull fashion.

4. An electronic circuit as defined in claim 2, wherein said transformer includes a center tapped primary winding coupled to the output of said differential amplifier.

5. An electronic circuit as defined in claim 1, wherein said a.c. output signal for said load is developed across a secondary winding of an output transformer.

6. An electronic circuit as defined in claim 1, wherein said negative feedback signal for said differential amplifier is developed across a secondary winding of a transformer.

7. An electronic circuit as defined in claim 1, wherein said output of said power amplifier includes a transformer having a primary and a pair of secondary windings.

8. An electronic circuit as defined in claim 1, wherein said second transistor is coupled to the same d.c. biasing points of said first transistor through a winding of a transformer which supplies said negative feedback signal.

* * * * *